US012040045B2

(12) United States Patent
An et al.

(10) Patent No.: US 12,040,045 B2
(45) Date of Patent: Jul. 16, 2024

(54) SEMICONDUCTOR DEVICE PERFORMING TRAINING OPERATION AND OPERATING METHOD THEREOF

(71) Applicant: SK hynix Inc., Gyeonggi-do (KR)

(72) Inventors: Soon Sung An, Gyeonggi-do (KR); Kwan Su Shon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 183 days.

(21) Appl. No.: 17/950,292

(22) Filed: Sep. 22, 2022

(65) Prior Publication Data

US 2023/0335167 A1  Oct. 19, 2023

(30) Foreign Application Priority Data

Apr. 13, 2022  (KR) .................... 10-2022-0045553

(51) Int. Cl.
*G11C 7/22* (2006.01)
*G11C 7/10* (2006.01)

(52) U.S. Cl.
CPC ............ *G11C 7/222* (2013.01); *G11C 7/1066* (2013.01); *G11C 7/109* (2013.01); *G11C 2207/2254* (2013.01)

(58) Field of Classification Search
CPC ....... G11C 7/222; G11C 7/1066; G11C 7/109; G11C 2207/2254
See application file for complete search history.

(56) References Cited

U.S. PATENT DOCUMENTS

| | | | | |
|---|---|---|---|---|
| 9,384,819 | B2 * | 7/2016 | Takai | .................. G11C 11/4076 |
| 9,792,969 | B1 * | 10/2017 | Kim | ......................... G11C 7/14 |
| 9,825,631 | B1 * | 11/2017 | Cho | ...................... G11C 29/021 |
| 10,262,708 | B2 * | 4/2019 | Jeong | ................... G11C 29/028 |
| 10,622,083 | B2 | 4/2020 | Regulapati et al. | |
| 10,692,551 | B2 * | 6/2020 | Hwang | ................ G11C 7/1093 |
| 11,670,397 | B2 * | 6/2023 | Lee | ...................... G11C 29/028 |
| | | | | 326/30 |

FOREIGN PATENT DOCUMENTS

KR  10-2015-0145003 A  12/2015

* cited by examiner

*Primary Examiner* — Son L Mai
(74) *Attorney, Agent, or Firm* — IP & T GROUP LLP

(57) ABSTRACT

A semiconductor device includes a data input circuit suitable for receiving a training clock to provide first data signals and a strobe signal according to a plurality of input control signals in a training mode; a delay circuit suitable for outputting second data signals by delaying the first data signals according to delay values corresponding to respective setting codes; a data alignment circuit suitable for outputting third data signals by aligning the second data signals according to the strobe signal; a code generation circuit suitable for generating a preliminary code corresponding to the third data signals according to the training clock, and sequentially storing the preliminary code as the setting codes according to a code-lock signal; and a lock-detection circuit suitable for activating the code-lock signal based on the training clock and the preliminary code.

20 Claims, 14 Drawing Sheets

SEMICONDUCTOR DEVICE PERFORMING TRAINING OPERATION AND OPERATING METHOD THEREOF

CROSS-REFERENCE TO RELATED APPLICATIONS

The present application claims priority to Korean Patent Application No. 10-2022-0045553, filed on Apr. 13, 2022, which is incorporated herein by reference in its entirety.

BACKGROUND

1. Field

Various embodiments of the present disclosure relate to semiconductor design technology, and more particularly, to a semiconductor device capable of performing a write training operation during a ZQ calibration operation.

2. Description of the Related Art

In general, a semiconductor device may transmit and receive data in synchronization with a clock. The semiconductor device may transmit and receive data using a data strobe signal having the same period as the clock. For example, a memory device among semiconductor devices may receive data transmitted from a memory controller in response to a data strobe signal during a write operation, and output data to the memory controller in synchronization with the data strobe signal during a read operation. Therefore, in order to improve the operational reliability of the semiconductor device, it is important to adjust a timing between the data strobe signal and the data. As the operating speed of the semiconductor device increases, a skew in the timing between the data strobe signal and the data is increasing according to various environments.

To address this concern, the semiconductor device may perform a write training operation and/or a read training operation to measure a data latch margin, and control the skew to be corrected by setting a delay value of a signal path of the data or the data strobe signal according to the measurement result.

SUMMARY

Embodiments of the present disclosure are directed to a semiconductor device capable of performing a write training operation of sequentially adjusting delay values of input paths of data signals according to a delay value of an input path of a data strobe signal, and an operating method thereof.

Embodiments of the present disclosure are directed to a semiconductor device capable of performing a write training operation prior to a ZQ calibration operation for adjusting impedance of a resistance group to be coupled to a calibration pad ZQ to be substantially identical to an external resistance RZQ, according to a calibration command, and an operating method thereof.

In accordance with an embodiment of the present disclosure, a semiconductor device includes a data input circuit suitable for receiving a training clock to provide first data signals and a strobe signal according to a plurality of input control signals in a training mode; a delay circuit suitable for outputting second data signals by delaying the first data signals according to delay values corresponding to respective setting codes; a data alignment circuit suitable for outputting third data signals by aligning the second data signals according to the strobe signal; a code generation circuit suitable for generating a preliminary code corresponding to the third data signals according to the training clock, and sequentially storing the preliminary code as the setting codes according to a code-lock signal; and a lock-detection circuit suitable for activating the code-lock signal based on the training clock and the preliminary code.

In accordance with an embodiment of the present disclosure, an operating method of a semiconductor device includes generating a calibration command during power-up thereof; generating a training mode signal in response to the calibration command; performing, according to the training mode signal, a training operation of sequentially setting delay values of respective delay lines coupled to respective data pads; generating a calibration mode signal upon completion of the training operation; and performing a calibration operation according to the calibration mode signal.

In accordance with an embodiment of the present disclosure, a semiconductor system includes a controller suitable for providing an initializing command; and a semiconductor device suitable for: generating a calibration command according to the initializing command, generating a training mode signal in response to the calibration command, performing, according to the training mode signal, a training operation of sequentially setting delay values of respective delay lines coupled to respective data pads, generating a calibration mode signal upon completion of the training operation, and performing a calibration operation according to the calibration mode signal.

In accordance with an embodiment of the present disclosure, an operating method of a semiconductor device includes performing, when powered up, a calibration operation after sequentially setting delay values of respective delay lines, wherein the sequentially setting includes: delaying an internally generated training clock through a selected delay line of the delay lines; aligning the delayed clock in synchronization with the training clock; changing, in synchronization with the training clock, a preliminary code according to a logic level of the aligned clock; and adjusting the delay value of the selected delay line according to the preliminary code, and wherein the preliminary code is changed until: the training clock toggles a predetermined number of times, or the preliminary code has one or more values within a stable range or a maximum or minimum value.

According to embodiments of the present invention, the semiconductor device may sequentially adjust the delay values of the input paths of the data signals according to the delay value of the input paths of the data strobe signal. Thus, the phase difference between the data signals can be reduced and the timing margin can be increased to thereby meet a time specification tDQ2DQ between the data signals and improve the operational reliability.

According to embodiments of the present invention, the semiconductor device may perform a training operation using signals generated in the inside, without a control signal provided from the outside, thereby minimizing the skew randomly generated for each semiconductor device. In particular, the semiconductor device may automatically perform the training operation before performing the ZQ calibration operation according to a calibration command generated during power-up, thereby improving the operation efficiency thereof.

These and other features and advantages of the present disclosure will become apparent to those skilled in the art from the following detailed description in conjunction with the following drawings.

DETAILED DESCRIPTION

Figure 1:
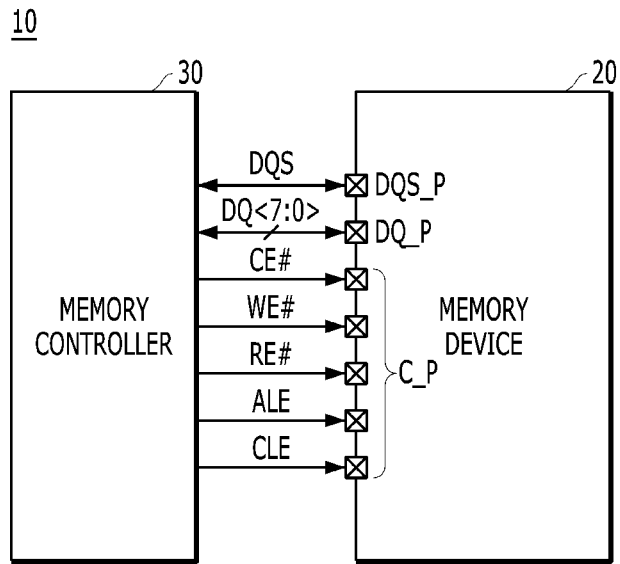
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will convey the scope of the present invention to those skilled in the art. Throughout this disclosure, like reference numerals refer to like parts throughout the various figures and embodiments of the present invention.

It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise. The articles 'a' and 'an' as used in this application and the appended claims should generally be construed to mean 'one or more' unless specified otherwise or it is clear from context to be directed to a singular form.

In the following embodiments, a memory device will be described as an example of a semiconductor device. However, the proposed invention is not limited thereto and may be applied to various types of semiconductor devices.

FIG. 1 is a block diagram illustrating a memory system 10 in accordance with an embodiment of the present invention.

Referring to FIG. 1, the memory system 10 may include a memory device 20 and a memory controller 30. In FIG. 1, signals exchanged between the memory controller 30 and the memory device 20 are illustrated. The memory device 20 may exchange a command CMD, an address ADD, or data DQ with the memory controller 30 in the form of data DQ<7:0> transmitted to the same data line through data pads DQ_P. In addition, the memory device 20 may exchange a data strobe signal DQS with the memory controller 30 through a data strobe pad DQS_P. Further, the memory device 20 may receive a chip enable signal CE #, an address latch enable signal ALE, a command latch enable signal CLE, a write enable signal WE #, and a read enable signal RE #through control pads C_P.

The chip enable signal CE #may be a signal indicating that the memory device 20 (i.e., a memory chip) is operable, and activated to a logic low level. The chip enable signal CE #may be selectively applied to memory chips coupled to the same channel. When the chip enable signal CE #is activated to a logic low level, it may denote that all operations within the memory chip are possible, and when the chip enable signal CE #is deactivated to a logic high level, it may denote that the memory chip is in a standby state.

The command latch enable signal CLE may be a signal for receiving the command CMD transmitted through the data pads DQ_P, and activated to a logic high level while the command CMD is input to the memory device 20. The address latch enable signal ALE may be a signal for receiving the address ADD transmitted through the data pads DQ_P, and activated to a logic high level while the address ADD is input to the memory device 20.

The write enable signal WE #may be toggled when the data DQ<7:0> including the command CMD and the address ADD are loaded to the memory device 20, and the read enable signal RE #may be toggled when the data DQ<7:0> including the data DQ are loaded to the memory controller 30. When the write enable signal, WE #transitions from a logic low level to a logic high level, that is, at a rising edge of the write enable signal WE #, the command CMD and the address ADD may be input to the memory device 20. According to an embodiment, when the write enable signal WE #transitions from a logic high level to a logic low level, that is, at a falling edge of the write enable signal WE #, the command CMD and the address ADD may be input to the memory device 20.

The memory device 20 may receive the data DQ<7:0> or output the data DQ<7:0> to the memory controller 30 through the data pads DQ_P. When the data DQ<7:0> are composed of 8 bits, each of the data pads DQ_P may be provided with 8 bits. However, the number of data pads DQ_P is not limited to eight, and may be expanded to 16 or 32 in various embodiments.

In a write operation, the memory device 20 may receive the data DQ<7:0> through the data pads DQ_P in synchronization with the data strobe signal DQS input through the data strobe pad DQS_P. For example, in a double data rate (DDR) mode, the memory device 20 may receive the data DQ<7:0> at every rising edge and falling edge of the data strobe signal DQS. In a read operation, when outputting the data DQ<7:0> through the data pads DQ_P, the memory device 20 may synchronize and output the data strobe signal DQS through the data strobe pad DQS_P. Accordingly, the memory device 20 may be a synchronous memory device that operates in synchronization with the data strobe signal DQS.

The write operation of the memory system 10 of FIG. 1 will be described below.

During the write operation, the memory controller 30 may provide the write enable signal WE #that toggles at a predetermined period, to the memory device 20. The memory controller 30 may provide the data DQ<7:0> including the command CMD indicating the write operation together with the command latch enable signal CLE to the memory device 20. When the command latch enable signal CLE becomes a logic high level, the memory device 20 may receive the command CMD through the data pads DQ_P according to the rising edge of the write enable signal WE #.

Thereafter, the memory controller 30 may provide the data DQ<7:0> including the address ADD together with the address latch enable signal ALE to the memory device 20. When the address latch enable signal ALE becomes a logic high level, the memory device 20 may receive the address ADD through the data pads DQ_P according to the rising edge of the write enable signal WE #. Thereafter, the memory controller 30 may provide the data DQ<7:0> to the memory device 20 together with the data strobe signal DQS. The memory device 20 may receive the data DQ<7:0> according to the data strobe signal DQS and store the data DQ<7:0> into a memory area designated by the address ADD.

Figure 2:
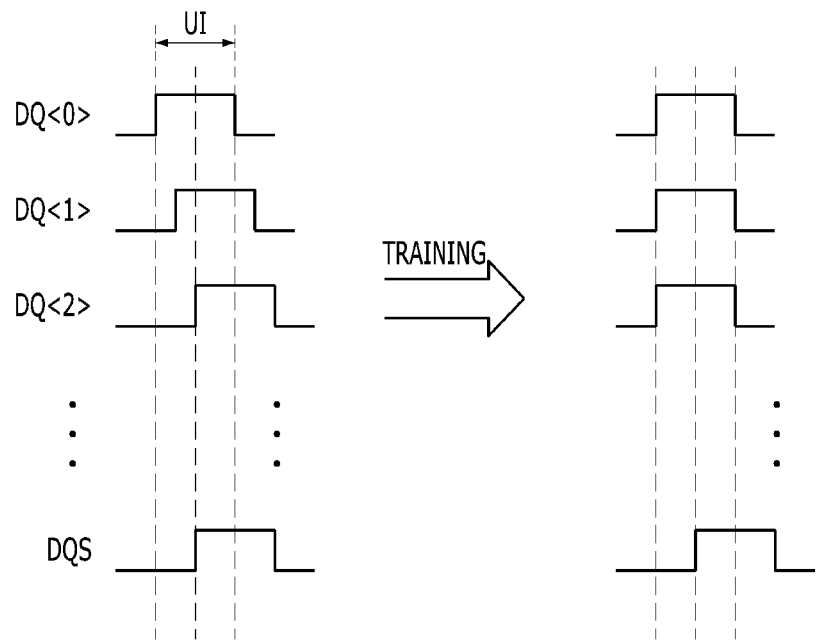
FIG. 2 is a timing diagram for describing a training operation of the memory device shown in FIG. 1 in accordance with an embodiment of the present invention.

The memory device 20 may include a latch circuit for latching the data DQ<7:0> according to the data strobe signal DQS. In this case, since the data pads DQ_P and the data strobe pad DQS_P are located at different distances from each other from the latch circuit, paths through which signals pass from the data pads DQ_P and the data strobe pad DQS_P to the latch circuit are all different. Due to the difference in the paths, a phase difference (i.e., skew) between each signal occurs. Referring to FIG. 2, each of the data DQ<7:0> may have a unit interval (UI)(i.e., a valid window) defined by a first edge (e.g., a rising edge) and a second edge (e.g., a falling edge). The memory device 20 may perform a write training operation of adjusting the delay amount (or compensating for timing) of each path so that the rising edge of the data strobe signal DQS is located at the center of the valid window of each data DQ<7:0>.

However, even if each path is ideally matched and arranged, the skew may randomly occur for each semiconductor device due to internal process variation, mismatch of internal wiring, internal power noise, etc., so there is a limit to correct skew through the write training operation.

Hereinafter, in accordance with an embodiment of the present invention, in order to minimize skew occurring randomly for each semiconductor device and meet a time specification tDQ2DQ between data signals, a method of performing a write training operation for sequentially adjusting delay values of input paths of the data signals may be described. In the following embodiments, components for performing a write operation will be mainly described which relate to the invention.

Figure 3:
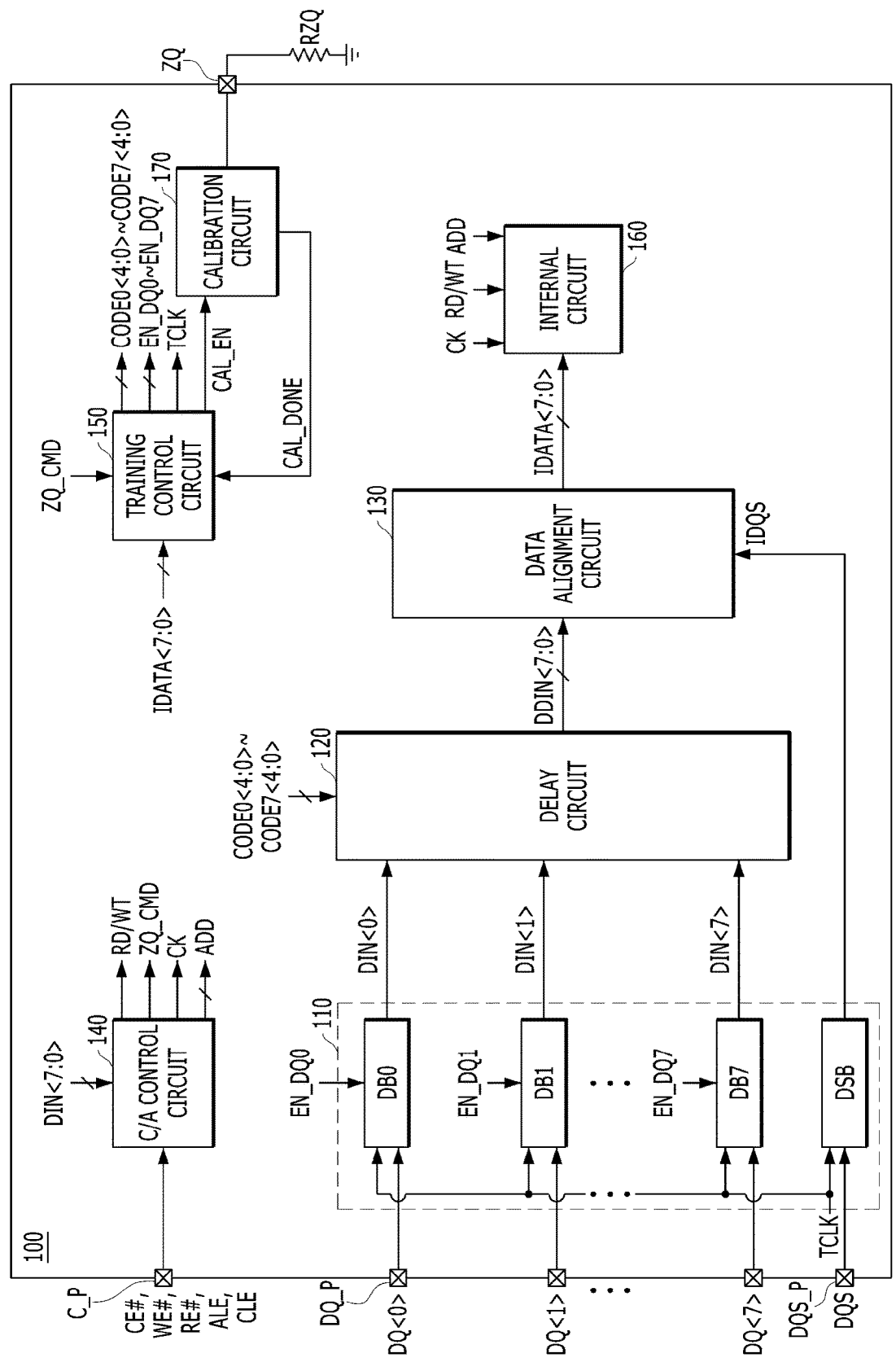
FIG. 3 is a block diagram illustrating a memory device in accordance with an embodiment of the present invention.

FIG. 3 is a block diagram illustrating a memory device 100 in accordance with an embodiment of the present invention.

Referring to FIG. 3, the memory device 100 may include a data input circuit 110, a delay circuit 120, a data alignment circuit 130, a command/address (C/A) control circuit 140, a training control circuit 150, and an internal circuit 160.

The data input circuit 110 may include a plurality of data buffers DB0 to DB7 respectively coupled to a plurality of data pads DQ_P, and a data strobe buffer DSB coupled to a data strobe pad DQS_P. In a normal mode such as a write operation, the plurality of data buffers DB0 to DB7 may receive data DQ<7:0> provided from an external device (e.g., the memory controller 30 of FIG. 1) through the data pads DQ_P, to provide first data signals DIN<7:0>. In the normal mode, the data strobe buffer DSB may receive a data strobe signal DQS provided from the external device through the data strobe pad DQS_P to provide it as an internal strobe signal IDQS. In a training mode, the data buffers DB0 to DB7 may receive a training clock TCLK according to a plurality of input control signals EN_DQ0 to EN_DQ7 to provide the first data signals DIN<7:0>. In the training mode, the data strobe buffer DSB may receive the training clock TCLK to provide it as the internal strobe signal IDQS. Hereinafter, a case where eight data pads DQ_P are provided and the data input circuit 110 includes first to eighth data buffers DB0 to DB7 respectively coupled to eight data pads DQ_P will be described as an example. A detailed configuration and operation of the first to eighth data buffers DB0 to DB7 will be described in FIG. 4.

The delay circuit 120 may output second data signals DDIN<7:0> by receiving first to eighth setting codes CODE0<4:0> to CODE7<4:0> and delaying the first data signals DIN<7:0> according to delay values respectively corresponding to the first to eighth setting codes CODE0<4:0> to CODE7<4:0>. The delay circuit 120 may include first to eighth delay lines (121 to 128 of FIG. 5) each of which receives a corresponding setting code of the first to eighth setting codes CODE0<4:0> to CODE7<4:0> and delays a corresponding first data signal of the first data signals DIN<7:0> according to a delay value set by the corresponding setting code. A detailed configuration and operation of the delay circuit 120 will be described with reference to FIGS. 5 and 6.

The data alignment circuit 130 may output third data signals IDATA<7:0> by aligning the second data signals DDIN<7:0> according to the internal strobe signal IDQS provided from the data strobe buffer DSB. A detailed configuration and operation of the data alignment circuit 130 will be described in FIG. 7.

The C/A control circuit 140 may receive a chip enable signal CE #, an address latch enable signal ALE, a command latch enable signal CLE, a write enable signal WE #, and a read enable signal RE #through control pads C_P, and may receive the first data signals DIN<7:0> from the first to eighth data buffers DB0 to DB7. When the command latch enable signal CLE becomes a logic high level in a state that the chip enable signal CE #is activated to a logic low level, the C/A control circuit 140 may receive the first data signals DIN<7:0> as a command CMD at a rising edge of the write enable signal WE #, and a write command WT, a read command RD, a calibration command ZQ_CMD, and the like by decoding the command CMD. For example, the C/A control circuit 140 may generate the calibration command ZQ_CMD according to the command CMD of a hexa code "FFh" indicating an initialization operation during power-up. In addition, the C/A control circuit 140 may generate a clock CK based on the write enable signal WE #. When the address latch enable signal ALE becomes a logic high level in a state that the chip enable signal CE #is activated to a logic low level, the C/A control circuit 140 may receive the first data signals DIN<7:0> as an address ADD at the rising edge of the write enable signal WE #.

The training control circuit 150 may enter the training mode in response to the calibration command ZQ_CMD. The training control circuit 150 may activate a training mode signal (TR_EN of FIG. 8) indicating entry to the training mode. The training control circuit 150 may generate first to eighth input control signals EN_DQ0 to EN_DQ7 which are sequentially activated according to the training mode signal TR_EN and a code-lock signal (CODE_LOCK of FIG. 8), and may generate a training completion signal (TR_DONE of FIG. 8) after all of the first to eighth input control signals EN_DQ0 to EN_DQ7 are activated. The training control circuit 150 may deactivate the training mode signal TR_EN according to the training completion signal TR_DONE and activate a calibration mode signal CAL_EN for performing a ZQ calibration operation.

Further, the training control circuit 150 may generate the training clock TCLK that toggles at a predetermined cycle according to the training mode signal TR_EN. The training control circuit 150 may generate a preliminary code (CODEA<4:0> of FIG. 8) corresponding to the third data signals IDATA<7:0> according to the training mode signal TR_EN, and may sequentially store the preliminary code CODEA<4:0> as the first to eighth setting codes CODE0<4:0> to CODE7<4:0> according to a code-lock signal (CODE_LOCK of FIG. 8). In addition, the training control circuit 150 may generate the code-lock signal CODE_LOCK based on the training clock TCLK and the preliminary code CODEA<4:0>. The training control circuit 150 may generate the code-lock signal CODE_LOCK when the toggling number of the training clock TCLK reaches a predetermined number of times or the preliminary code CODEA<4:0> satisfies a predetermined condition. A detailed configuration and operation of the training control circuit 150 will be described in FIG. 8.

The internal circuit 160 may include a plurality of memory cells. The internal circuit 160 may perform a write operation of writing the third data signals IDATA<7:0> to the memory cells designated by the address ADD in response to the write command WT, and may perform a read operation of reading out the third data signals IDATA<7:0> from the memory cells designated by the address ADD in response to the read command RD.

Moreover, the memory device 100 may further include a calibration circuit 170 that generates a termination control code for adjusting a resistance or impedance of an on-die termination circuit. The calibration circuit 170 may generate the termination control code varying depending on a condition such as a process, voltage, and temperature (PVT) by performing the ZQ calibration operation of adjusting the impedance of a resistance group to be coupled to a calibration pad ZQ to be substantially identical to an external resistance RZQ. The calibration circuit 170 may perform the ZQ calibration operation according to the calibration mode signal CAL_EN, and may generate a calibration completion signal CAL_DONE after the termination control code is generated by the ZQ calibration operation. The training control circuit 150 may deactivate the calibration mode signal CAL_EN according to the calibration completion signal CAL_DONE.

Although not shown in FIG. 3, the memory device 100 may further include a data output circuit for outputting data output from the internal circuit 160 to the external device through the data pads DQ_P during a read operation. The data output circuit may include a termination circuit for providing pull-up and/or pull-down impedance to the data pads DQ_P during the read operation or the write operation according to the termination control code generated by the calibration circuit 170.

Hereinafter, a detailed configuration of each of the circuits of FIG. 3 will be described with reference to FIGS. 4 to 8.

Figure 4:
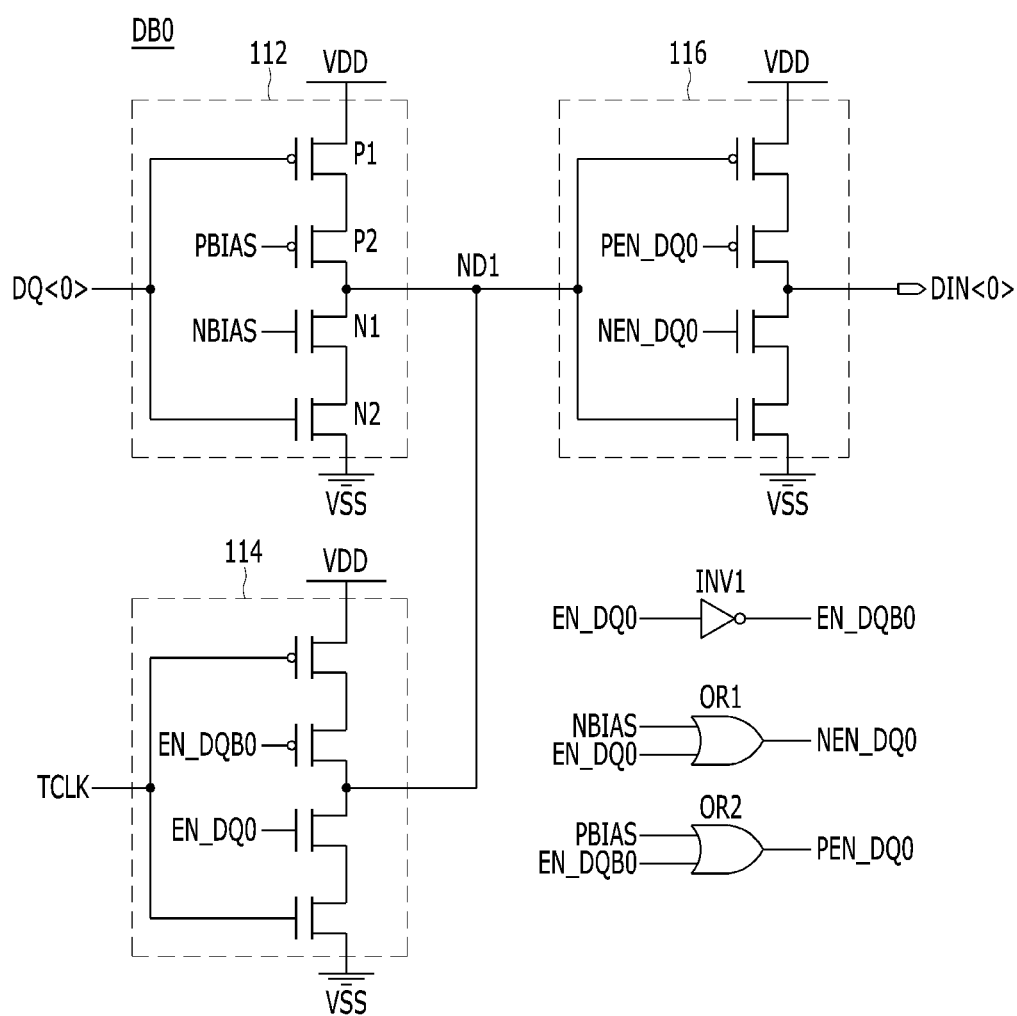
FIG. 4 is a circuit diagram illustrating a first data buffer of FIG. 3 in accordance with an embodiment of the present invention.

FIG. 4 is a circuit diagram illustrating the first data buffer DB0 of FIG. 3 in accordance with an embodiment of the present invention. The remaining data buffers DB1 to DB7 may have substantially the same configuration as the first data buffer DB0.

Referring to FIG. 4, the first data buffer DB0 may include a first inverter INV1, first and second OR gate OR1 and OR2, and first to third buffer circuits 112, 114, and 116.

The first inverter INV1 may generate an inverted input control signal EN_DQB0 by inverting the first input control signal EN_DQ0. The first OR gate OR1 may generate a third bias signal NEN_DQ0 by performing a logic OR operation on the first input control signal EN_DQ0 and a first bias signal NBIAS. The second OR gate OR2 may generate a fourth bias signal PEN_DQ0 by performing a logic OR operation on the inverted input control signal EN_DQB0 and a second bias signal PBIAS. For reference, the first bias signal NBIAS is activated to a logic high level and the second bias signal PBIAS is activated to a logic low level, in a normal mode.

The first buffer circuit 112 may include a first pull-up transistor P1, a second pull-up transistor P2, a first pull-down transistor N1, and a second pull-down transistor N2, which are coupled in series between a supply voltage (VDD) terminal and a ground voltage (VSS) terminal. The first pull-up transistor P1 and the second pull-down transistor N2 may receive the data DQ<0> through a gate, the first pull-down transistor N1 may receive the first bias signal NBIAS through a gate, and the second pull-up transistor P2 may receive the second bias signal PBIAS through a gate. One end (e.g., a drain) of the second pull-up transistor P2 and the first pull-down transistor N1 may be commonly coupled to a first node ND1. With the above configuration, in the normal mode such as the write operation, the first buffer circuit 112 may invert a logic level of the data DQ<0> input through the data pad DQ_P to transfer the inverted logic level to the first node ND1.

The second buffer circuit 114 may have substantially the same configuration as the first buffer circuit 112 except for receiving the training clock TCLK, the first input control signal EN_DQ0, and the inverted input control signal EN_DQB0. When the first input control signal EN_DQ0 is activated in the training mode, the second buffer circuit 114 may invert a logic level of the training clock TCLK to transfer the inverted logic level to the first node ND1.

Likewise, the third buffer circuit 116 may have substantially the same configuration as the first buffer circuit 112 except for receiving a signal of the first node ND1, the third bias signal NEN_DQ0, and the fourth bias signal PEN_DQ0. In both of the normal mode and the training mode, the third buffer circuit 116 may invert the signal of the first node ND1 to output the inverted signal as the first data signal DIN<0>.

With the above configuration, the first to eighth data buffers DB0 to DB7 may receive the data DQ<7:0> to provide the first data signals DIN<7:0> in the normal mode. The first to eighth data buffers DB0 to DB7 may receive the training clock TCLK according to first to eighth input control signals EN_DQ0 to EN_DQ7 to provide the first data signals DIN<7:0> in the training mode.

Figure 5:
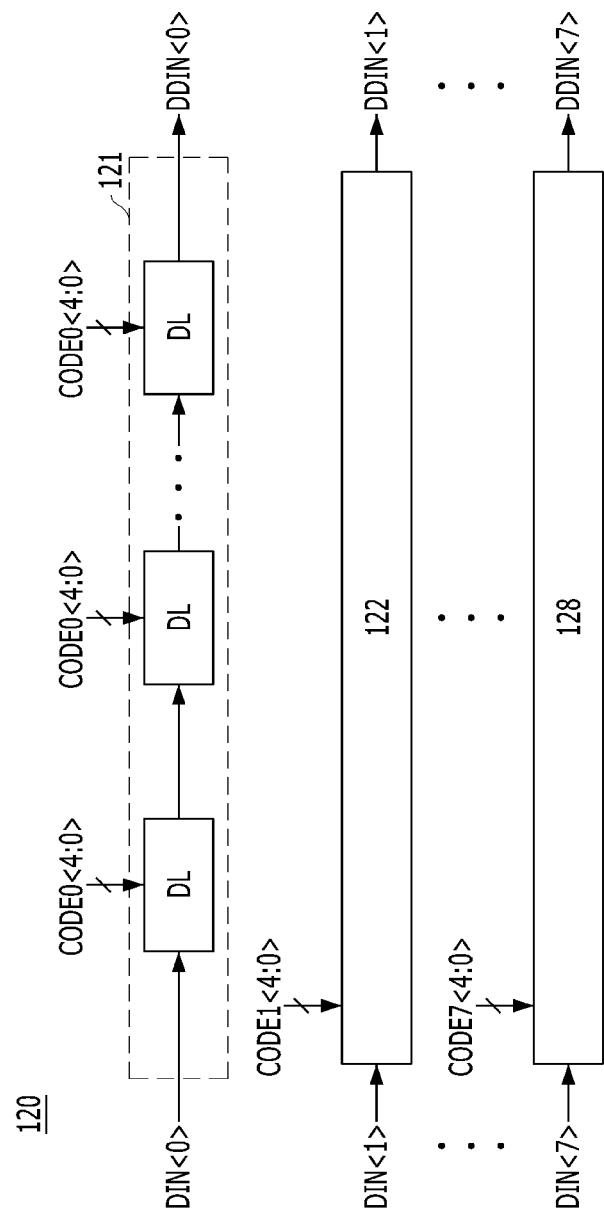
FIG. 5 is a configuration diagram illustrating a delay circuit of FIG. 3 in accordance with an embodiment of the present invention.
Figure 6:
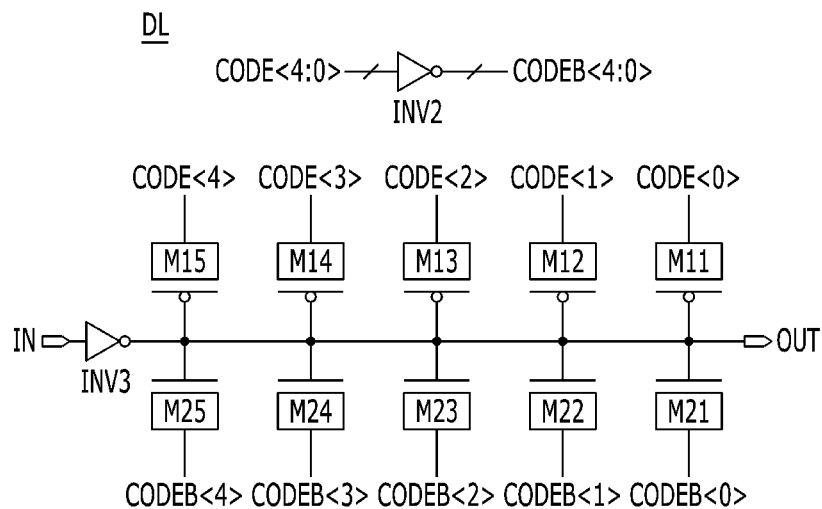
FIG. 6 is a circuit diagram illustrating a unit delay line of FIG. 5 in accordance with an embodiment of the present invention.

FIG. 5 is a configuration diagram illustrating the delay circuit 120 of FIG. 3 in accordance with an embodiment of the present invention. FIG. 6 is a circuit diagram illustrating a unit delay line DL of FIG. 5 in accordance with an embodiment of the present invention.

Referring to FIG. 5, the delay circuit 120 may include the first to eighth delay lines 121 to 128 each of which receives a corresponding setting code of the first to eighth setting codes CODE0<4:0> to CODE7<4:0> and delays a corresponding data signal of the first data signals DIN<7:0> according to a delay value set by the corresponding setting code. Each of the first to eighth delay lines 121 to 128 may be implemented with a digital controlled delay line (DCDL) in which delay values are controlled according to digital codes.

For example, the first delay line 121 may include a plurality of unit delay lines DL coupled in series, for outputting the second data signal DDIN<0> by delaying the first data signal DIN<0>. Each unit delay line DL may receive the first setting code CODE0<4:0> and delay a signal at an input terminal by a unit delay value set by the first setting code CODE0<4:0> and output the delayed signal to an output terminal. The first delay line 121 may have a delay value corresponding to a value obtained by multiplying the number of unit delay lines DL by the unit delay value.

Referring to FIG. 6, each unit delay line DL may include a first inverter INV2, a second inverter INV3, first to fifth MOS capacitors M11 to M15, and sixth to tenth MOS capacitors M21 to M25.

The first inverter INV2 may invert each bit of a corresponding setting code CODE<4:0> to generate an inverted setting code CODEB<4:0>. In FIG. 6, although one first inverter INV2 is illustrated, the first inverter INV2 may be disposed in an amount corresponding to the number of bits of the setting code CODE<4:0>, and may be disposed in common to a plurality of unit delay lines DL according to an embodiment.

The second inverter INV3 may be coupled between an input terminal IN and an output terminal OUT, and may invert a signal at the input terminal IN to output an invert signal to the output terminal (OUT). The first to fifth MOS capacitors M11 to M15 may be implemented as PMOS transistors in which a gate is commonly connected to the output terminal OUT. The first to fifth MOS capacitors M11 to M15 may respectively receive bits of the setting code CODE<4:0> through their own drain and source. The sixth to tenth MOS capacitors M21 to M25 may be implemented as NMOS transistors in which a gate is commonly connected to the output terminal OUT. The sixth to tenth MOS capacitors M21 to M25 may respectively receive bits of the inverted setting code CODEB<4:0> through their own drain and source.

With the above configuration, the first to eighth delay lines 121 to 128 may delay the first data signals DIN<7:0> by the delay values set according to the first to eighth setting codes CODE0<4:0> to CODE7<4:0> to output the second data signals DDIN<7:0>.

Figure 7:
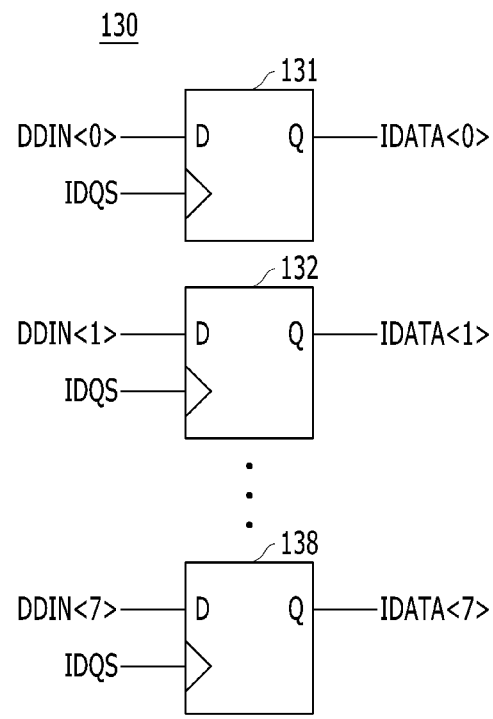
FIG. 7 is a circuit diagram illustrating a data alignment circuit of FIG. 3 in accordance with an embodiment of the present invention.

FIG. 7 is a circuit diagram illustrating the data alignment circuit 130 of FIG. 3 in accordance with an embodiment of the present invention.

Referring to FIG. 7, the data alignment circuit 130 may include first to eighth flip-flops 131 to 138 for receiving bits of the second data signals DDIN<7:0>, respectively. The first to eighth flip-flops 131 to 138 may latch the second data signals DDIN<7:0> according to the internal strobe signal IDQS to output the third data signals IDATA<7:0>. Accordingly, the third data signals IDATA<7:0> may be aligned to parallel data according to the internal strobe signal IDQS.

Figure 8:
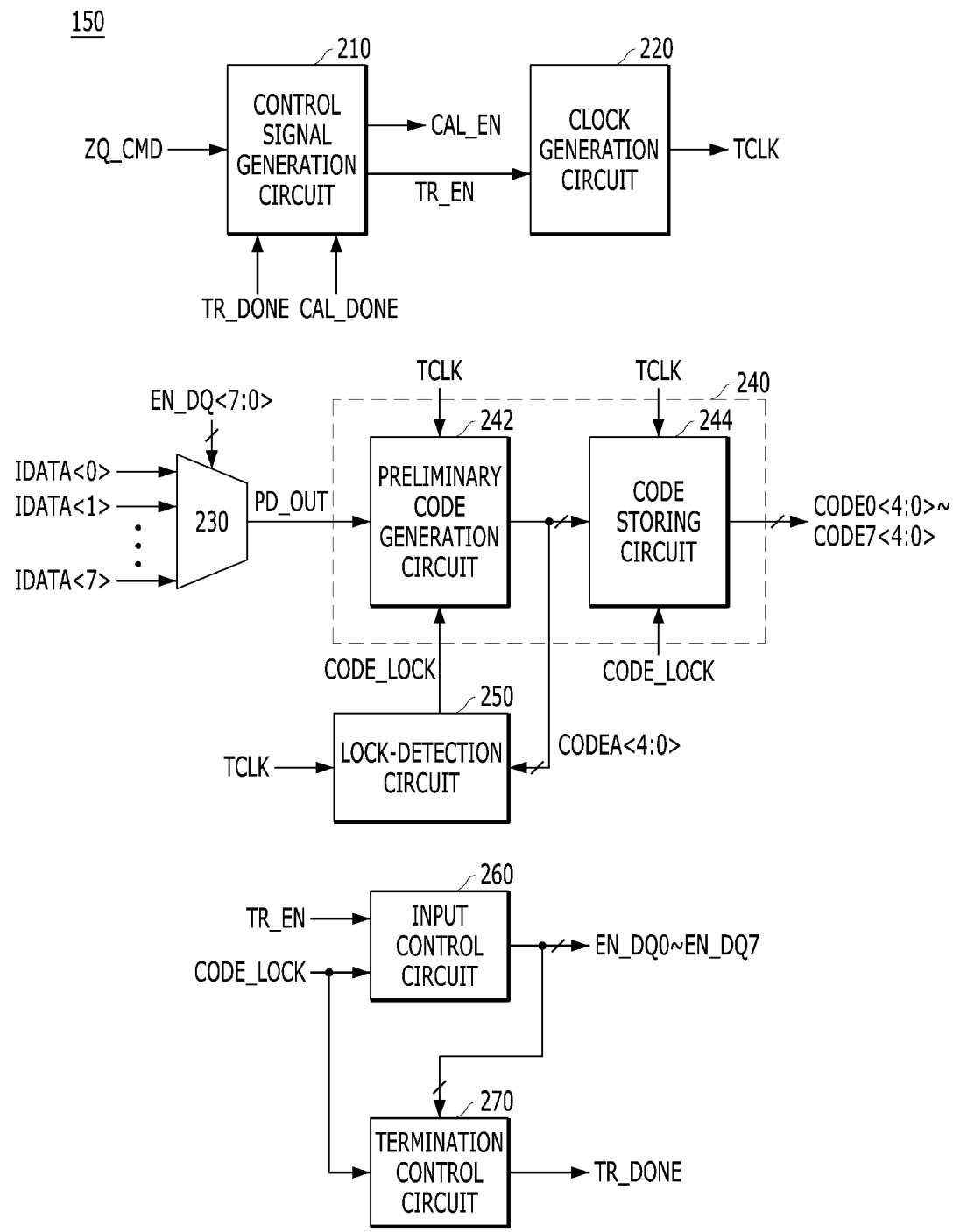
FIG. 8 is a detailed block diagram illustrating a training control circuit of FIG. 3 in accordance with an embodiment of the present invention.

FIG. 8 is a detailed block diagram illustrating the training control circuit 150 of FIG. 3 in accordance with an embodiment of the present invention.

Referring to FIG. 8, the training control circuit 150 may include a control signal generation circuit 210, a clock generation circuit 220, a data selection circuit 230, a code generation circuit 240, a lock-detection circuit 250, an input control circuit 260, and a termination control circuit 270.

The control signal generation circuit 210 may generate the training mode signal TR_EN in response to the calibration command ZQ_CMD. The control signal generation circuit 210 may generate the calibration mode signal CAL_EN for performing the calibration operation according to the training completion signal TR_DONE indicating completion of the training operation. The control signal generation circuit 210 may deactivate the training mode signal TR_EN according to the training completion signal TR_DONE, and deactivate the calibration mode signal CAL_EN according to the calibration completion signal CAL_DONE indicating the completion of the calibration operation. The calibration mode signal CAL_EN may be provided to the calibration circuit 170 of FIG. 2. A detailed configuration of the control signal generation circuit 210 will be described in FIG. 9.

The clock generation circuit 220 may generate the training clock TCLK that toggles in a predetermined cycle according to the training mode signal TR_EN. A detailed configuration of the clock generation circuit 220 will be described in FIG. 10.

The data selection circuit 230 may select one of the third data signals IDATA<7:0> according to the first to eighth input control signals EN_DQ0 to EN_DQ7, and output the selected signal as a target signal PD_OUT. The data selection circuit 230 may output the target signal PD_OUT by selecting the third data signal IDATA<0> when the first input control signal EN_DQ0 is activated, selecting the third data signal IDATA<1> when the second input control signal EN_DQ1 is activated, and in this way, selecting the third data signal IDATA<7> when the eighth input control signal EN_DQ7 is activated The code generation circuit 240 may generate the preliminary code CODEA<4:0> corresponding to the target signal PD_OUT provided from the data selection circuit 230, according to the training clock TCLK, and store the preliminary code CODEA<4:0> as the first to eighth setting codes CODE0<4:0> to CODE7<4:0> according to the code-lock signal CODE_LOCK, in the training mode. The code generation circuit 240 may store and output first to eighth setting codes CODE0<4:0> to CODE7<4:0> in synchronization with the training clock TCLK whenever the preliminary code CODEA<4:0> is updated. The code generation circuit 240 may sequentially lock the stored first to eighth setting codes CODE0<4:0> to CODE7<4:0> whenever the code-lock signal CODE_LOCK is activated, such that the stored code values are not updated any more but are fixed.

In detail, the code generation circuit 240 may include a preliminary code generation circuit 242 and a code storing circuit 244.

The preliminary code generation circuit 242 may be synchronized with the training clock TCLK, and increase or decrease a code value of the preliminary code CODEA<4:0> by "+1" according to the target signal PD_OUT. The preliminary code generation circuit 242 may initialize the preliminary code CODEA<4:0> to an initial value when the code-lock signal CODE_LOCK is activated. The initial value may be set to a middle value (i.e., 16h of "10000") of the preliminary code CODEA<4:0>. Preferably, the preliminary code generation circuit 242 may be implemented with an up/down counter. Each time the training clock TCLK toggles, the up/down counter may increase the code value of the preliminary code CODEA<4:0> by "+1" from the previous value according to the target signal PD_OUT of a logic high level, and decrease the preliminary code CODEA<4:0> by "+1" from the previous value according to the target signal PD_OUT of a logic low level.

The code storing circuit 244 may store and output the preliminary code CODEA<4:0> as the first to eighth setting codes CODE0<4:0> to CODE7<4:0> in synchronization with the training clock TCLK whenever the preliminary code CODEA<4:0> is updated. The code storing circuit 244 may sequentially lock the stored first to second setting codes CODE0<4:0> to CODE7<4:0> whenever the code-lock signal CODE_LOCK is activated. A detailed configuration of the code storing circuit 244 will be described in FIG. 11.

The lock-detection circuit 250 may generate the code-lock signal CODE_LOCK based on the training clock TCLK and the preliminary code CODEA<4:0>. The lock-detection circuit 250 may activate the code-lock signal CODE_LOCK when the toggling number of the training clock TCLK reaches a predetermined number of times, the preliminary code CODEA<4:0> reaches a target value by maintaining a fixed value within a predetermined range, or the preliminary code CODEA<4:0> reaches a maximum or minimum value. A detailed configuration of the lock-detection circuit 250 will be described in FIG. 12.

The input control circuit 260 may generate the first to eighth input control signals EN_DQ0 to EN_DQ7 sequentially activated, according to the training mode signal TR_EN and the code-lock signal CODE_LOCK. When the training mode signal TR_EN is activated, the input control circuit 260 may activate the first input control signal EN_DQ0 and then sequentially activate the second to eighth input control signals EN_DQ1 to EN_DQ7 whenever the code-lock signal CODE_LOCK is activated. A detailed configuration of the input control circuit 260 will be described with reference to FIG. 13.

The termination control circuit 270 may generate the training completion signal TR_DONE according to the code-lock signal CODE_LOCK after all of the first to eighth input control signals EN_DQ0 to EN_DQ7 are sequentially activated. The termination control circuit 270 may activate the training completion signal TR_DONE when the code-lock signal CODE_LOCK is activated after the eighth input control signal EN_DQ7 is activated.

Hereinafter, a detailed configuration of each of the circuits of FIG. 8 will be described with reference to FIGS. 9 to 13.

Figure 9:
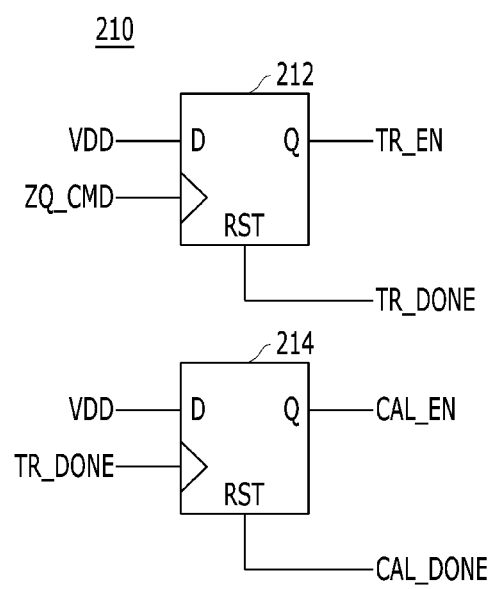
FIG. 9 is a detailed circuit diagram illustrating a control signal generation circuit of FIG. 8 in accordance with an embodiment of the present invention.

FIG. 9 is a detailed circuit diagram illustrating the control signal generation circuit 210 of FIG. 8 in accordance with an embodiment of the present invention.

Referring to FIG. 9, the control signal generation circuit 210 may include a first signal generation part 212 and a second signal generation part 214

The first signal generation part 212 may generate the training mode signal TR_EN activated according to the calibration command ZQ_CMD and deactivated according to the training completion signal TR_DONE. The first signal generator 212 may be implemented with a D flip-flop that receives a supply voltage VDD as an input signal D, receives the calibration command ZQ_CMD as a clock signal, receives the training completion signal TR_DONE as a reset signal RST, and outputs the training mode signal TR_EN as an output signal Q.

The second signal generation part 214 may generate the calibration mode signal CAL_EN activated according to the training completion signal TR_DONE and deactivated according to the calibration completion signal CAL_DONE. The second signal generation part 214 may be implemented with a D flip-flop that receives the supply voltage VDD as an input signal D, receives the training completion signal TR_DONE as a clock signal, receives the calibration completion signal CAL_DONE as a reset signal RST, and outputs the calibration mode signal CAL_EN as an output signal Q.

Figure 10:
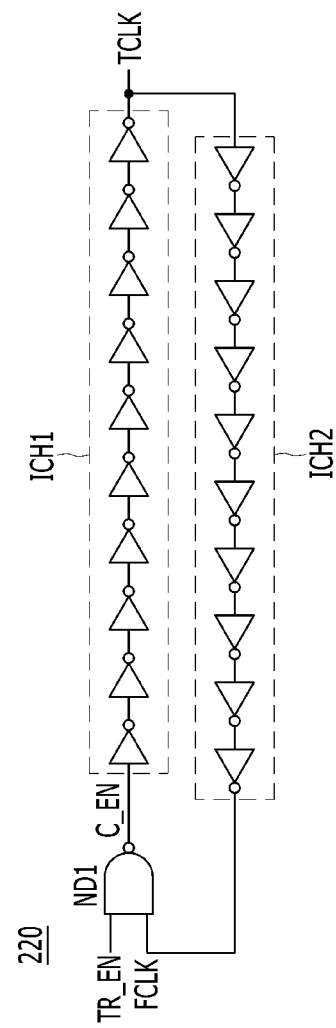
FIG. 10 is a detailed circuit diagram illustrating a clock generation circuit of FIG. 8 in accordance with an embodiment of the present invention.

FIG. 10 is a detailed circuit diagram illustrating the clock generation circuit 220 of FIG. 8 in accordance with an embodiment of the present invention.

Referring to FIG. 10, the clock generation circuit 220 may be implemented with a ring oscillator. For example, the clock generation circuit 220 may include a NAND gate ND1, a first inverter chain ICH1, and a second inverter chain ICH2. Each of the first inverter chain ICH1 and the second inverter chain ICH2 may include an even number of inverters.

The NAND gate ND1 may generate an enable signal C_EN by performing a logic NAND operation on the training mode signal TR_EN and a feedback clock FCLK output from the second inverter chain ICH2. The first inverter chain ICH1 may delay the enable signal C_EN to output the training clock TCLK. The second inverter chain ICH2 may delay the training clock TCLK to output the feedback clock FCLK.

With the above configuration, the clock generation circuit 220 may generate the training clock TCLK that toggles with a period determined according to the number of inverters according to the training mode signal TR_EN.

Figure 11:
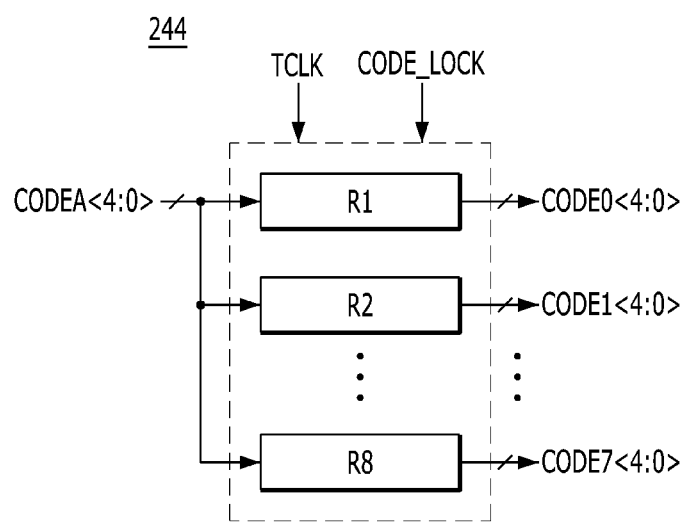
FIG. 11 is a detailed circuit diagram illustrating a code storing circuit of FIG. 8 in accordance with an embodiment of the present invention.

FIG. 11 is a detailed circuit diagram illustrating the code storing circuit 244 of FIG. 8 in accordance with an embodiment of the present invention.

Referring to FIG. 11, the code storing circuit 244 may include first to eighth registers R1 to R8 for storing the first to eighth setting codes CODE0<4:0> to CODE7<4:0>, respectively.

The first to eighth registers R1 to R8 may store and output the preliminary code CODEA<4:0> as the first to eighth setting codes CODE0<4:0> to CODE7<4:0> in synchronization with the training clock TCLK whenever the preliminary code CODEA<4:0> is updated. The first to eighth registers R1 to R8 may sequentially lock the stored first to eighth setting codes CODE0<4:0> to CODE7<4:0> without being updated any more whenever the code-lock signal CODE_LOCK is activated. For example, when the code-lock signal CODE_LOCK is first activated, the first register R1 may fix a code value of the stored first setting code CODE0<4:0>. When the code-lock signal CODE_LOCK is activated for the second time, the second register R2 may fix the code value of the stored second setting code CODE1<4:0>. In this way, when the code-lock signal CODE_LOCK is activated for the eighth time, the eighth register R8 may fix the code value of the eighth setting code CODE7<4:0>.

Figure 12:
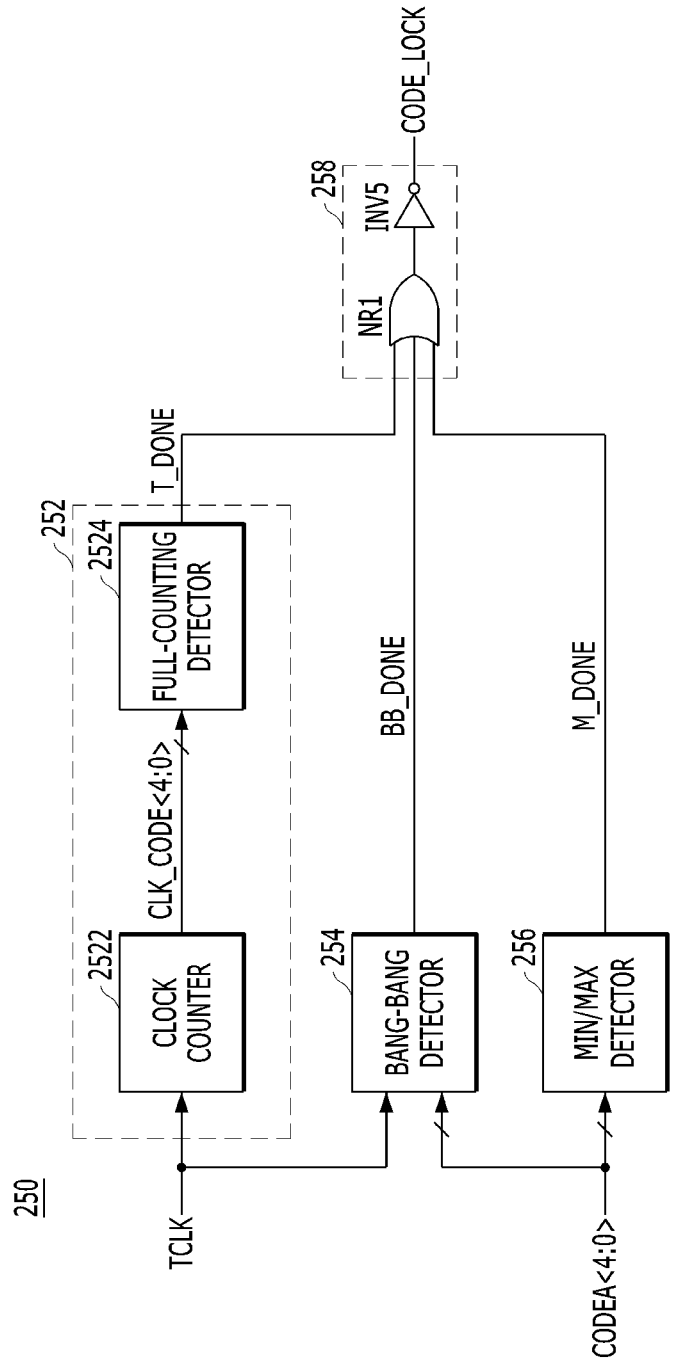
FIG. 12 is a detailed circuit diagram illustrating a lock-detection circuit of FIG. 8 in accordance with an embodiment of the present invention.

FIG. 12 is a detailed circuit diagram illustrating the lock-detection circuit 250 of FIG. 8 in accordance with an embodiment of the present invention.

Referring to FIG. 12, the lock-detection circuit 250 may include a timer detector 252, a bang-bang detector 254, a minimum/maximum (MIN/MAX) detector 256 and an output circuit 258.

The timer detector 252 may generate a first lock signal T_DONE by detecting a case where the toggling number of the training clock TCLK reaches a predetermined number of times. For example, the timer detector 252 may generate the first lock signal T_DONE activated to a logic high level when the toggling number of the training clock TCLK reaches "32". The timer detector 252 may include a clock counter 2522 and a full-counting detector 2524. The clock counter 2522 may generate a 5-bit counting code CLK_CODE<4:0> by counting the toggle number of the training clock TCLK. The full-counting detector 2524 may activate the first lock signal T_DONE by detecting that all bits of the counting code CLK_CODE<4:0> become high bits. The full-counting detector 2524 may be implemented with logic gates for performing a logic AND operation on all bits of the counting code CLK_CODE<4:0>.

The bang-bang detector 254 may generate a second lock signal BB_DONE by detecting when the preliminary code CODEA<4:0> shifts between two fixed values according to the training clock TCLK. The bang-bang detector 254 may detect when the code value of the preliminary code CODEA<4:0> is consecutively stored four times each time the training clock TCLK toggles, and the code value of four times is shifted between two fixed values. For example, the bang-bang detector 254 may generate the second lock signal BB_DONE activated to a logic high level when the code value of the preliminary code CODEA<4:0> shifts to "15h-16h-15h-16h". For reference, as the second lock signal BB_DONE is activated, it may be determined that the code value of the preliminary code CODEA<4:0> reaches a target value. In this case, the code value "16h" of the preliminary code CODEA<4:0> may be finally stored in a corresponding register of the code storing circuit 244.

The MIN/MAX detector 256 may generate a third lock signal M_DONE by detecting a case where the preliminary code CODEA<4:0> reaches the maximum value or minimum value. The MIN/MAX detector 256 may generate the third lock signal M_DONE activated to a logic high level when the preliminary code CODEA<4:0> reaches the maximum value of "11111" or the minimum value of "00000".

The output circuit 258 may activate the code-lock signal CODE_LOCK when the first lock signal T_DONE, the second lock signal BB_DONE, or the third lock signal M_DONE is activated. The output circuit 258 may be implemented with logic gates (e.g., a NOR gate NR1 and an inverter INV5) for performing a logic AND operation on the first lock signal T_DONE, the second lock signal BB_DONE, and the third lock signal M_DONE.

With the above configuration, the lock-detection circuit 250 may activate the code-lock signal CODE_LOCK when the toggling number of the training clock TCLK reaches a predetermined number of times, the preliminary code CODEA<4:0> maintains a fixed value within a predetermined range, or the preliminary code CODEA<4:0> reaches the maximum or minimum value.

Figure 13:
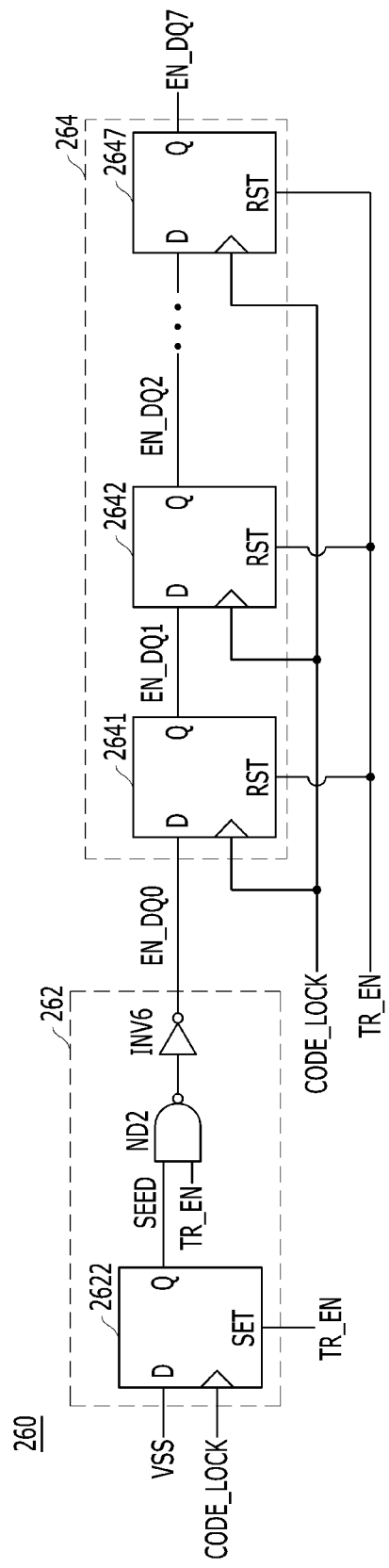
FIG. 13 is a detailed circuit diagram illustrating an input control circuit of FIG. 8 in accordance with an embodiment of the present invention.

FIG. 13 is a detailed circuit diagram illustrating the input control circuit 260 of FIG. 8 in accordance with an embodiment of the present invention.

Referring to FIG. 13, the input control circuit 260 may include a first input controller 262 and a second input controller 264.

The first input controller 262 may include a first D flip-flop 2622, a first NAND gate ND2, and a first inverter INV6. The first D flip-flop 2622 may receive a ground voltage VSS as an input signal D, the code-lock signal CODE_LOCK as a clock signal, the training mode signal TR_EN as a set signal SET, and output a seed signal SEED as an output signal Q. When the training mode signal TR_EN is activated, the first D flip-flop 2622 may initialize the seed signal SEED to a logic high level. When the code-lock signal CODE_LOCK is activated, the first D flip-flop 2622 may output the seed signal SEED of a logic low level. The first NAND gate ND2 and the first inverter INV6 may perform a logic AND operation on the seed signal SEED and the training mode signal TR_EN to output the first input control signal EN_DQ0. With the above configuration, the first input control unit 262 may generate the first input control signal EN_DQ0 that is activated when the training mode signal TR_EN is activated and deactivated once the code-lock signal CODE_LOCK is activated.

The second input controller 264 may include second to eighth D flip-flops 2641 to 2647 coupled in series. The second D flip-flop 2641 may receive the first input control signal EN_DQ0 as an input signal D, and the second to eighth D flip-flops 2641 to 2647 may output the second to eighth input control signals EN_DQ1 to EN_DQ7, respectively. The second to eighth D flip-flops 2641 to 2647 may receive the code-lock signal CODE_LOCK as a clock signal and the training mode signal TR_EN as a reset signal RST. The second to eighth D flip-flops 2641 to 2647 may initialize all of the second to eighth input control signals EN_DQ1 to EN_DQ7 to a logic low level when the training mode signal TR_EN is activated. When the code-lock signal CODE_LOCK is activated, the second to eighth D-flipflops 2641 to 2647 may sequentially shift the first input control signal EN_DQ0 to output the first to eighth input control signals EN_DQ1 to EN_DQ7. With the above configuration, the second input control unit 264 may sequentially activate the second to eighth input control signals EN_DQ1 to EN_DQ7 whenever the code-lock signal CODE_LOCK is activated after the first input control signal EN_DQ0 is activated.

Hereinafter, an operation of the memory device 100 according to an embodiment of the present invention will be described with reference to FIGS. 1 to 16.

Figure 14:
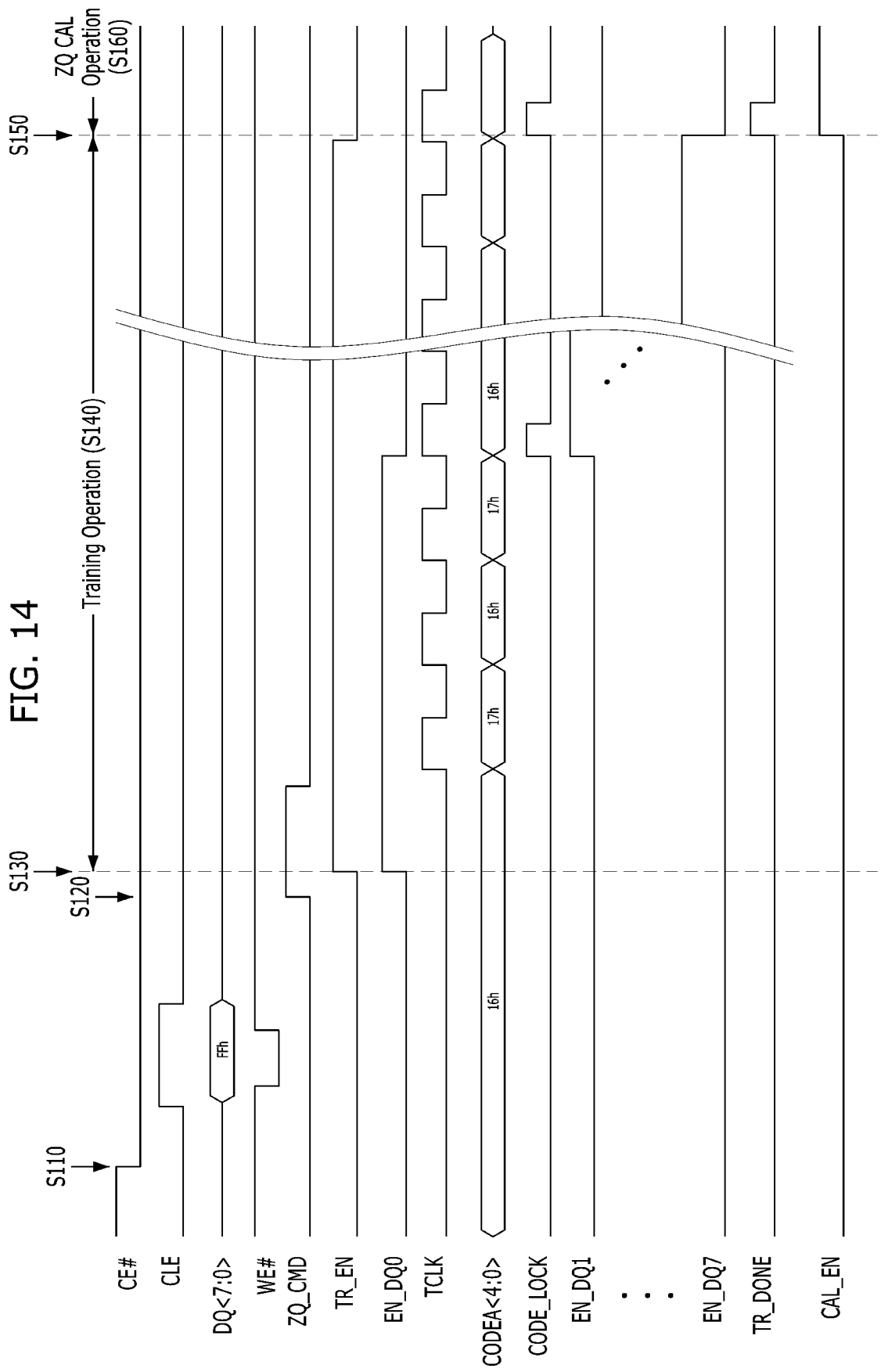
FIG. 14 is a timing diagram for describing an operation of a memory device in accordance with an embodiment of the present invention.
Figure 15:
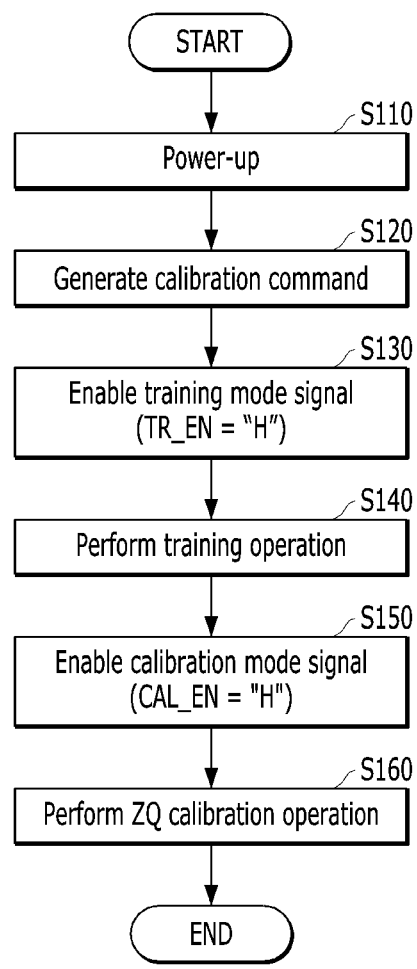
FIGS. 15 and 16 are flow chart diagrams for describing an operation of a memory device in accordance with an embodiment of the present invention.
Figure 16:
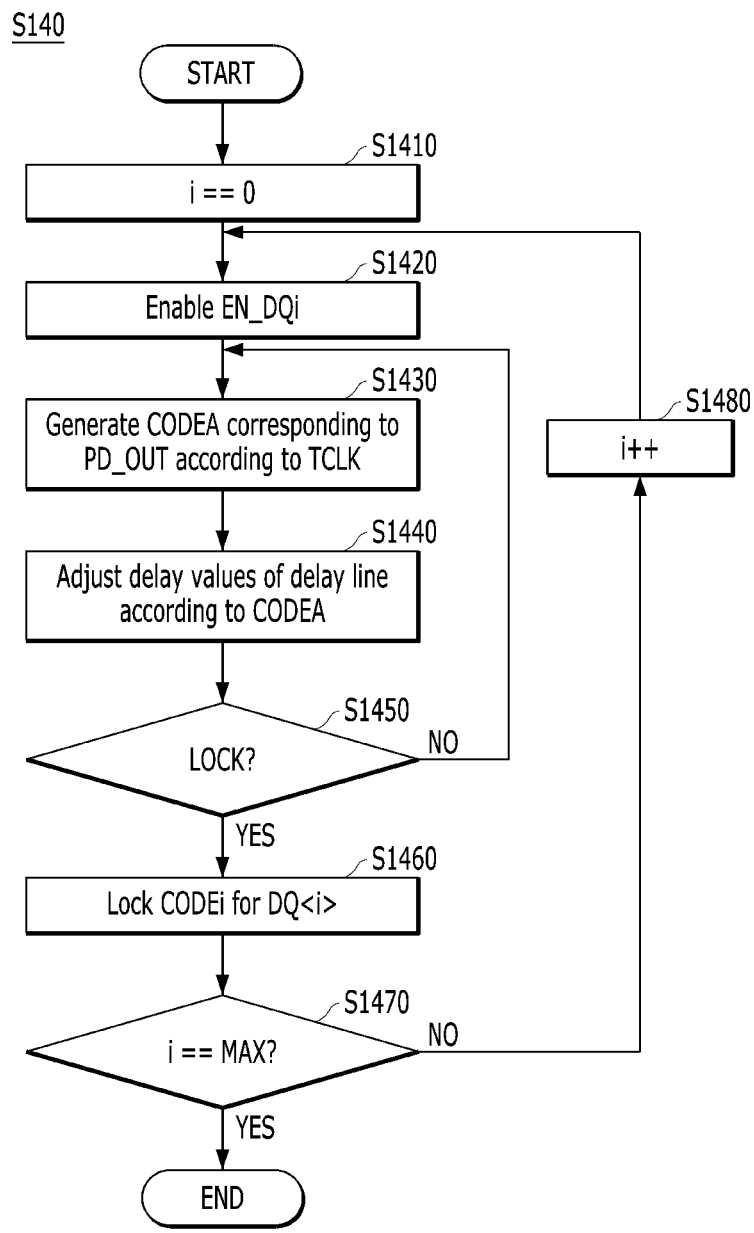

FIG. 14 is a timing diagram for describing an operation of a memory device in accordance with an embodiment of the present invention. FIGS. 15 and 16 are flow chart diagrams for describing an operation of a memory device in accordance with an embodiment of the present invention.

Referring to FIGS. 14 and 15, during power-up (at S110), the memory controller 30 may provide the chip enable signal CE #of a logic low level to the memory device 20, and provide the data DQ<7:0> including the command CMD of "FFh" indicating an initialization operation together with the command latch enable signal CLE of a logic high level. The C/A control circuit 140 of the memory device 20 may receive the data DQ<7:0> of "FFh" at a rising edge of the write enable signal WE #, and generate the calibration command ZQ_CMD according to the received data DQ<7:0> (at S120).

The control signal generation circuit 210 may activate the training mode signal TR_EN in response to the calibration command ZQ_CMD (at S130). According to the training mode signal TR_EN, the memory device 100 may perform a training operation of sequentially setting delay values of the first to eighth delay lines 121 to 128 coupled to the data pads DQ_P (at S140).

In detail, referring to FIGS. 14 and 16, when the training mode signal TR_EN is activated (at S1410), the input control circuit 260 activates the first input control signal EN_DQ0 (at S1420), and the clock generation circuit 220 may generate the training clock TCLK that toggles at a predetermined cycle. The first data buffer DB0 among the first to eighth to eighth data buffers DB0 to DB7 may receive the training clock TCLK according to the first input control signal EN_DQ0 to provide the first data signal DIN<0>. The data strobe buffer DSB may receive the training clock TCLK to provide the internal strobe signal IDQS. In this case, all of the remaining data buffers DB1 to DB7 may be deactivated according to the deactivated second to eighth input control signals EN_DQ1 to EN_DQ7.

Meanwhile, in synchronization with the training clock TCLK, the code generation circuit 240 may output the preliminary code CODEA<4:0> that is set to an initial value (e.g., "16h"), as the first to eighth setting codes CODE0<4:0> to CODE7<4:0>. The first to eighth delay lines 121 to 128 may output the second data signals DDIN<7:0> by delaying the first data signals DIN<7:0> by the delay values respectively corresponding to the first to eighth setting codes CODE0<4:0> to CODE7<4:0>. The data alignment circuit 130 may output the third data signals IDATA<7:0> by aligning the second data signals DDIN<7:0> according to the internal strobe signal IDQS. The data selection circuit 230 may select the third data signal IDATA<0> among the third data signals IDATA<7:0> according to the first input control signal EN_DQ0, and output the selected data signal IDATA<0> as the target signal PD_OUT.

In synchronization with the training clock TCLK, the preliminary code generation circuit 242 may increase the code value of the preliminary code CODEA<4:0> by "+1" according to the target signal PD_OUT to generate the code value as "17h" (at S1430). The code storing circuit 244 may store and output the preliminary code CODEA<4:0> as the first to eighth setting codes CODE0<4:0> to CODE7<4:0> whenever the preliminary code CODEA<4:0> is updated. The first to eighth delay lines 121 to 128 may delay the first data signals DIN<0:7> again by a set delay value according to the adjusted setting code to output the second data signals DDIN<0:7> (at S1440).

After the above operations S1430 to S1440 are repeatedly performed, the lock-detection circuit 250 may activate the second lock signal BB_DONE when detecting that the preliminary code CODEA<4:0> is shifted between two fixed values. As a result, the lock-detection circuit 250 may activate the code-lock signal CODE_LOCK ("YES" of S1450).

When the code-lock signal CODE_LOCK is activated, the preliminary code generation circuit 242 may initialize the preliminary code CODEA<4:0> to the initial value (e.g., "16h"), and the code storing circuit 244 may lock the current first setting code CODE0<4:0> (e.g., "17h") to be fixed without being updated any more (at S1460). Thereafter, the input control circuit 260 may activate the second input control signal EN_DQ1 (at S1480).

As the second to eighth input control signals EN_DQ1 to EN_DQ7 are sequentially activated, the above operations S1420 to S1460 are repeatedly performed and finally, when the eighth setting code CODE7<4:0> for the eighth delay line 128 is locked, the termination control circuit 270 may activate the training completion signal TR_DONE ("YES" of S1470).

Referring back to FIGS. 14 and 15, the control signal generation circuit 210 may activate the calibration mode signal CAL_EN for performing the calibration operation according to the training completion signal TR_DONE (at S150).

The calibration circuit 170 may generate the termination control code by performing the ZQ calibration operation of adjusting the impedance of the resistance group to be coupled to the calibration pad ZQ to be substantially identical to the external resistance RZQ, according to the calibration mode signal CAL_EN (at S160).

As described above, in accordance with an embodiment of the present invention, the semiconductor device may automatically perform the write training operation before performing the ZQ calibration operation, according to the calibration command generated therein during power-up. Thus, it is possible to improve the operation efficiency and, at the same time, minimize skew randomly generated for each semiconductor device. Further, during the write training operation, the semiconductor device may sequentially adjust the delay values of the input paths of the data signals according to the delay value of the input path of the data strobe signal. Thus, it is possible to reduce the phase difference between the data signals while increasing the timing margin to meet the time specification tDQ2DQ between the data signals and improving the operation reliability.

While the present invention has been described with respect to the specific embodiments, it will be apparent to those skilled in the art that various changes and modifications may be made without departing from the spirit and scope of the present invention as defined in the following claims.

For example, the logic gates and transistors described in the above embodiments may have different positions and types according to the polarity of input signals. Furthermore, the embodiments may be combined to form additional embodiments.

What is claimed is:

1. A semiconductor device, comprising:
   a data input circuit suitable for receiving a training clock to provide first data signals and a strobe signal according to a plurality of input control signals in a training mode;
   a delay circuit suitable for outputting second data signals by delaying the first data signals according to delay values corresponding to respective setting codes;
   a data alignment circuit suitable for outputting third data signals by aligning the second data signals according to the strobe signal;
   a code generation circuit suitable for generating a preliminary code corresponding to the third data signals according to the training clock, and sequentially storing the preliminary code as the setting codes according to a code-lock signal; and
   a lock-detection circuit suitable for activating the code-lock signal based on the training clock and the preliminary code.

2. The semiconductor device of claim 1, further comprising:
   a control signal generation circuit suitable for generating a training mode signal indicating entry to the training mode in response to a calibration command;

a clock generation circuit suitable for generating the training clock according to the training mode signal; and an input control circuit suitable for generating, according to the training mode signal and the code-lock signal, the input control signals that are sequentially activated.

3. The semiconductor device of claim 2, further comprising a termination control circuit suitable for generating a training completion signal according to the code-lock signal after all of the input control signals are activated, wherein the control signal generation circuit is further suitable for generating a calibration mode signal for performing a calibration operation according to the training completion signal.

4. The semiconductor device of claim 3, wherein the control signal generation circuit includes:

a first signal generation part suitable for generating the training mode signal activated according to the calibration command and deactivated according to the training completion signal; and a second signal generation part suitable for generating the calibration mode signal activated according to the training completion signal and deactivated according to a calibration completion signal.

5. The semiconductor device of claim 3, wherein the input control circuit includes:

a first input controller suitable for activating, among first to N-th input control signals, the first input control signal when the training mode signal is activated; and a second input controller suitable for sequentially activating the second to N-th input control signals whenever the code-lock signal is activated after the first input control signal is activated.

6. The semiconductor device of claim 1, wherein the data input circuit includes a plurality of data buffers coupled to respective data pads and suitable for receiving the respective input control signals, and wherein each of the data buffers includes:

a first buffer circuit suitable for providing, in a normal mode, a first node with a data signal input through the corresponding data pad;

a second buffer circuit suitable for providing, in the training mode, the first node with the training clock in response to the corresponding input control signal; and a third buffer circuit suitable for outputting, as a corresponding first data signal of the first data signals, the data signal or the training clock provided to the first node.

7. The semiconductor device of claim 1, wherein the delay circuit includes a plurality of delay lines each suitable for outputting a corresponding second data signal of the second data signals by delaying a corresponding first data signal of the first data signals according to the delay value set by a corresponding setting code of the setting codes.

8. The semiconductor device of claim 7, wherein each of the delay lines includes serially coupled unit delay lines, each including:

an inverter coupled between input and output terminals thereof;

a plurality of first-type MOS capacitors suitable for receiving bits of the corresponding setting code through respective drains and sources thereof, and commonly coupled to the output terminal through gates thereof; and a plurality of second-type MOS capacitors suitable for receiving inverted bits of the corresponding setting code through respective drains and sources thereof, and commonly coupled to the output terminal through gates thereof.

9. The semiconductor device of claim 1, further comprising a data selection circuit suitable for:

selecting a third data signal of the third data signals according to the input control signals, and outputting, as a target signal, the selected third data signal to the code generation circuit.

10. The semiconductor device of claim 1, wherein the code generation circuit includes:

a preliminary code generation circuit operable in synchronization with the training clock and suitable for:

increasing or decreasing a code value of the preliminary code according to a target signal among the third data signals, and initializing the preliminary code according to the code-lock signal; and a code storing circuit operable in synchronization with the training clock and suitable for:

sequentially storing and outputting the preliminary code as the setting codes, and sequentially locking the stored setting codes whenever the code-lock signal is activated.

11. The semiconductor device of claim 10, wherein the code storing circuit includes a plurality of registers suitable for respectively storing and outputting the preliminary code as the setting codes in synchronization with the training clock, and sequentially locking the setting codes respectively stored therein whenever the code-lock signal is activated.

12. The semiconductor device of claim 1, wherein the lock-detection circuit activates the code-lock signal when:

a toggling number of the training clock reaches a predetermined number of times, the preliminary code shifts between two fixed values according to the training clock, or the preliminary code reaches a maximum value or minimum value.

13. An operation method of a semiconductor device, comprising:

generating a calibration command during power-up thereof;

generating a training mode signal in response to the calibration command;

performing, according to the training mode signal, a training operation of sequentially setting delay values of respective delay lines coupled to respective data pads;

generating a calibration mode signal upon completion of the training operation; and performing a calibration operation according to the calibration mode signal.

14. The operation method of claim 13, wherein the performing of the training operation includes:

activating a code-lock signal by performing, for each of the delay values, operations of: delaying a training clock through a selected delay line among the delay lines, aligning, according to a strobe signal, a delayed clock to output an internal data signal, generating a preliminary code corresponding to the internal data signal, and adjusting the delay value of the selected delay line according to the preliminary code; and outputting a training completion signal indicating the completion after the code-lock signal is activated for all delay lines.

15. The operation method of claim 14, wherein the generating of the preliminary code includes increasing or decreasing a code value of the preliminary code according to the internal data signal.

16. The operation method of claim 14, wherein the code-lock signal is activated when:
 a toggling number of the training clock reaches a predetermined number of times,
 the preliminary code shifts between two fixed values according to the training clock, or
 the preliminary code reaches a maximum value or minimum value.

17. The operation method of claim 14, further comprising locking, when the code-lock signal is activated, the preliminary code as a setting code for setting the delay value of the selected delay line.

18. The operation method of claim 13, wherein the calibration operation includes adjusting an impedance of a resistance group to be coupled to a calibration pad to be substantially identical to an external resistance.

19. A semiconductor system, comprising:
 a controller suitable for providing an initializing command; and
 a semiconductor device suitable for:
 generating a calibration command according to the initializing command,
 generating a training mode signal in response to the calibration command,
 performing, according to the training mode signal, a training operation of sequentially setting delay values of respective delay lines coupled to respective data pads,
 generating a calibration mode signal upon completion of the training operation, and
 performing a calibration operation according to the calibration mode signal.

20. The semiconductor system of claim 19, wherein the semiconductor device includes:
 a control signal generation circuit suitable for generating the training mode signal in response to the calibration command;
 a clock generation circuit suitable for generating a training clock according to the training mode signal;
 an input control circuit suitable for generating, according to the training mode signal and a code-lock signal, a plurality of input control signals that are sequentially activated;
 a data input circuit suitable for receiving the training clock to provide first data signals and a strobe signal according to the input control signals;
 a delay circuit suitable for outputting second data signals by delaying the first data signals according to delay values corresponding to respective setting codes;
 a data alignment circuit suitable for outputting third data signals by aligning the second data signals according to the strobe signal;
 a code generation circuit suitable for generating a preliminary code corresponding to the third data signals according to the training clock, and sequentially storing the preliminary code as the setting codes according to the code-lock signal; and
 a lock-detection circuit suitable for generating the code-lock signal based on the training clock and the preliminary code.

* * * * *